United States Patent [19]

Hsue et al.

[11] Patent Number: 5,380,676

[45] Date of Patent: Jan. 10, 1995

[54] METHOD OF MANUFACTURING A HIGH DENSITY ROM

[75] Inventors: Chen-Chiu Hsue; Ming-Tzong Yang; Te-Sun Wu, all of Hsin-Chu, Taiwan, Prov. of China

[73] Assignee: United Microelectronics Corporation, Hsinchu, Taiwan, Prov. of China

[21] Appl. No.: 247,680

[22] Filed: May 23, 1994

[51] Int. Cl.6 .................................................. H01L 21/70
[52] U.S. Cl. .......................................... 437/52; 437/45; 437/48; 437/46
[58] Field of Search .................... 437/49, 48, 52, 45, 437/46, 43

[56] References Cited

U.S. PATENT DOCUMENTS

| | | | |
|---|---|---|---|
| 4,833,514 | 5/1989 | Esquivel et al. | 357/23.5 |
| 4,898,840 | 2/1990 | Okuyama | 437/41 |
| 4,904,615 | 2/1990 | Okuyama et al. | 437/52 |
| 5,027,175 | 6/1991 | Iwasa | 357/23.5 |
| 5,087,584 | 2/1992 | Wada et al. | 437/43 |
| 5,091,329 | 2/1992 | Bekkering et al. | 437/52 |
| 5,094,971 | 3/1992 | Kanebako | 437/48 |
| 5,149,664 | 9/1992 | Shin et al. | 437/41 |
| 5,242,850 | 9/1993 | Tasaka | 437/45 |
| 5,264,386 | 11/1993 | Yang | 437/52 |
| 5,270,237 | 12/1993 | Sang et al. | 437/45 |
| 5,278,078 | 1/1994 | Kanebako et al. | 437/45 |
| 5,306,657 | 4/1994 | Yang | 437/52 |
| 5,308,777 | 5/1994 | Hong | 437/191 |
| 5,330,924 | 7/1994 | Huang et al. | 437/48 |

*Primary Examiner*—Brian E. Hearn
*Assistant Examiner*—Tuan Nguyen
*Attorney, Agent, or Firm*—George O. Saile; Graham S. Jones, II

[57] ABSTRACT

A ROM is formed by depositing a first layer composed of a material selected from polysilicon and polycide on the substrate, patterning the first layer by masking and etching, depositing a dielectric layer over the first layer and patterning the dielectric layer and the first layer into the pattern of first conductor lines, forming a contact window through the dielectric layer down to the substrate, depositing a second layer composed of a material selected from polysilicon and polycide on the device and forming second conductor lines directed orthogonally to the first conductor lines formed from the first layer, and ion implanting into the substrate through the second layer to form a contact region electrically connected to the second conductor lines of the second layer.

16 Claims, 14 Drawing Sheets

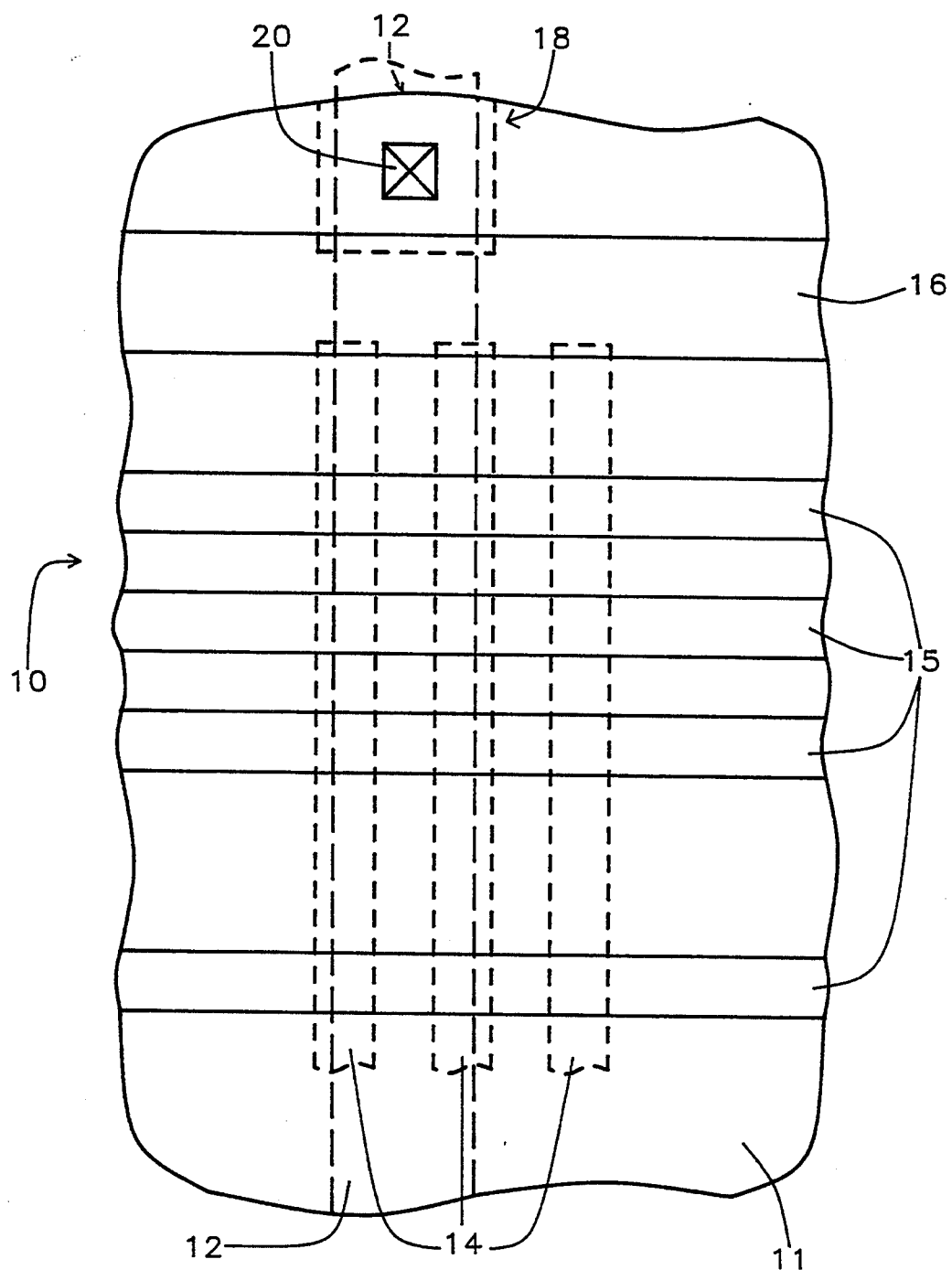
FIG. 1 – Prior Art

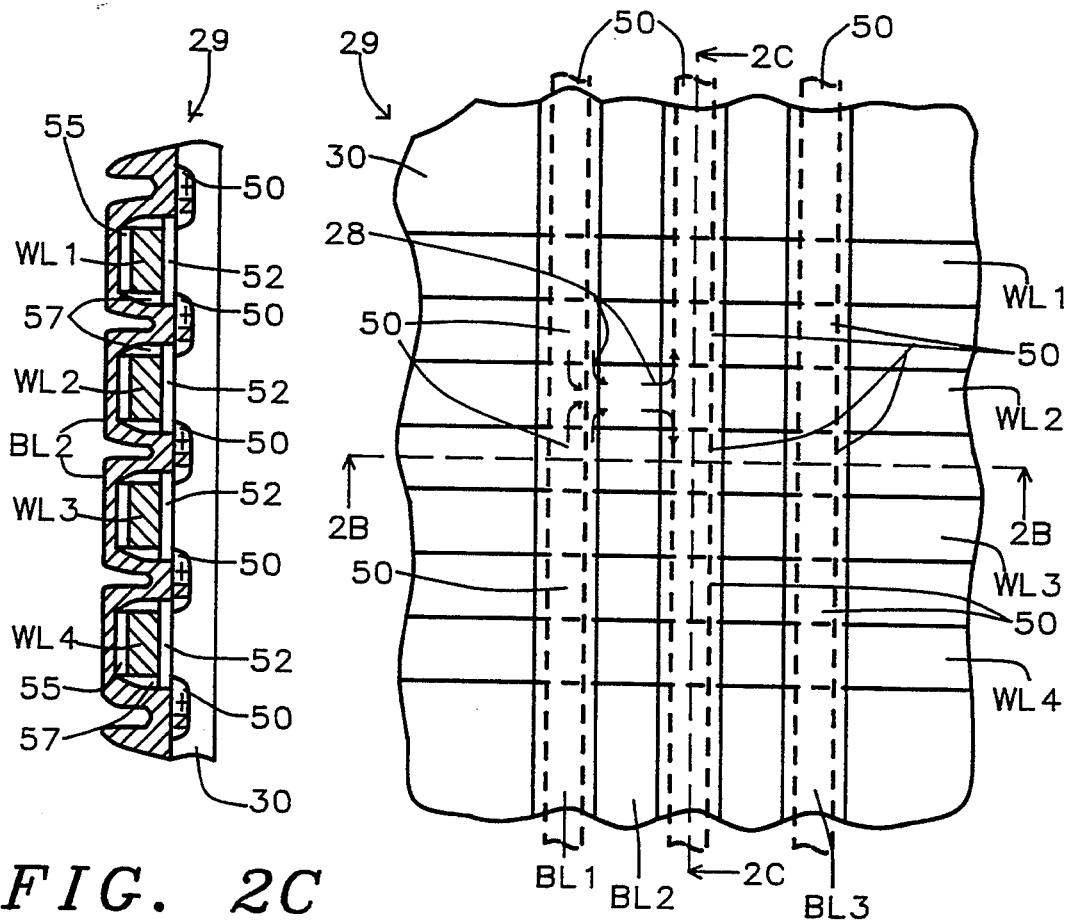
FIG. 2C
FIG. 2A
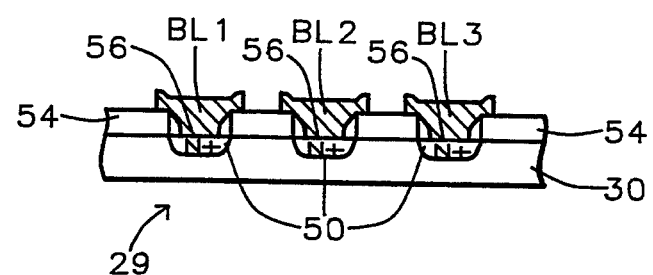
FIG. 2B

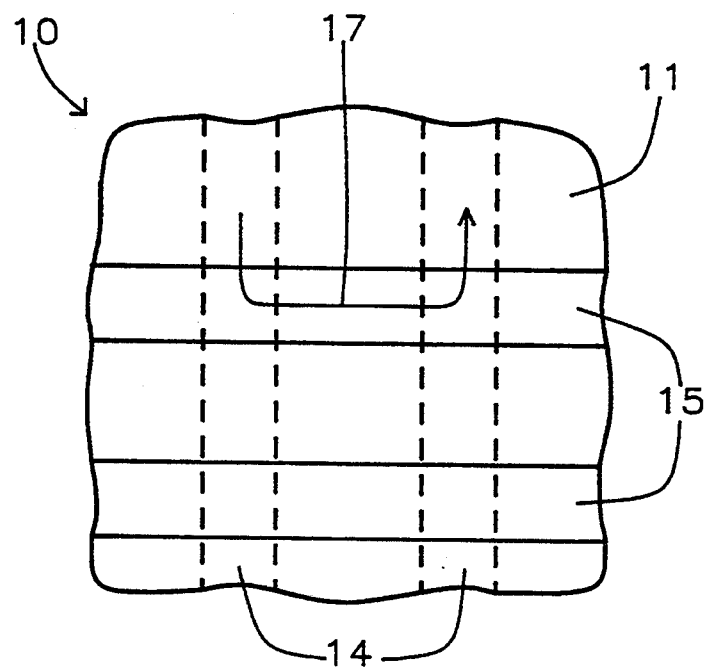
FIG. 4A – Prior Art
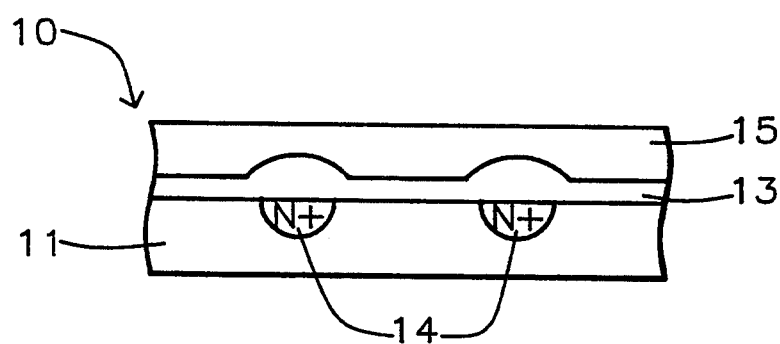
FIG. 4B – Prior Art

METHOD OF MANUFACTURING A HIGH DENSITY ROM

BACKGROUND OF THE INVENTION

1. Field of the Invention

This invention relates to high density ROM memories and more particularly to improved word and bit line structures.

2. Description of Related Art

FIG. 1 shows a prior art device 10 including a semiconductor substrate 11 composed of P− doped silicon with buried N+ BN+ layer 14, 18 in the substrate 11. BN+ bit lines 14 are oriented vertically. The substrate 11 is covered with gate oxide layer as is well understood by those skilled in the art. A plurality of polysilicon word lines 15 are formed upon the surface of the substrate oriented orthogonally to the buried bit lines. Parallel with the word lines 15 is a select transistor line 16 which slightly overlaps the buried bit lines 14 and BN+ region 18 which comprises an active contact area. A bit line contact 20 is provided for connection between bit line 12 and BN+ active contact 18. As can be seen, the buried N+ regions are formed before the gate oxide layer and before the deposition of the Polysilicon lines 15. To achieve high density memory structures with the design of FIG. 1 it is necessary to shrink the width of the buried bit lines 14. Avoidance of the possibility punchthrough requires additional buried N+ dopant. The result of the narrowing of the bit lines 14 is that the sheet resistance is increased, so more contact area is required to decrease the bit line resistance $R_\approx$ for the cells to pick up the cell signal. But the increase in contact area increases the effective cell size.

BN+ formation before the gate oxide and polysilicon deposition is a very early step. For high density, BN+ width will shrink and punchthrough issue so BN+ dopant also decreases. BN+ sheet resistance is more severe so more bit line contact is needed. The bit line $R_\approx$ is reduced to pick up the cell signal. This increases the effective cell size.

There are at least two major problems of ROM devices with buried N+ (BN+) regions of the variety shown in FIG. 1. One of the problems is higher BN+ sheet resistance 5∼200 Ω/≅, so usually there is a bit line pickup every ∼32 word lines, so the effective cell size is increased due to the bit line contact and select transistor area shared by of the bit line contact and select transistor.

The second issue is the problem of BN+ to BN+ punchthrough, due to N+ dopant diffusion.

The improvement provided by this invention is use of a second conductor (polysilicon, polycide, refractory metal, or metal) for bit line instead of BN+ to resolve the issues pertaining to the sheet resistance and the punchthrough problems.

U.S. Pat. No. 4,833,514 of Esquivel for "Planar FAMOS Transistor with Sealed Floating Gate and DCS +N₂O Oxide", U.S. Pat. No. 4,898,840 of Okuyama for "Semiconductor Integrated Circuit Device and a Method of Producing the Same", U.S. Pat. No. 4,904,615 of Okuyama et al for "Method of Making a Read Only Memory Device", U.S. Pat. No. 5,027,175 of Iwasa for "Integrated Circuit Semiconductor Device Having Improved Wiring Structure", U.S. Pat. No. 5,087,584 of Wada et al for "Process for Fabricating a Contactless Floating Gate Memory Array Utilizing Wordline Trench Vias", and U.S. Pat. No. 5,149,664 of Shin et al for "Self-Aligning Ion Implantation Method for Semiconductor Device Having Multi-Gate Type MOS Transistor Structure"

FIGS. 4A and 4B show a prior art conventional buried N+ ROM cell 10 with a P− semiconductor substrate 11, polysilicon 1 lines 15, buried bit lines 14 and current line 17 from the high voltage bit line 14 through line 15 to the lower voltage bit line 14. The gate oxide 13 is located between the buried bit lines 14 and the polysilicon 1 lines 15. The disadvantage of the design of FIGS. 4A and 4B is that there is a high buried N+ resistance. In addition, the BN+ to BN+ punchthrough voltage is a problem as stated above.

SUMMARY OF THE INVENTION

In accordance with this invention a method is provided for manufacture of a semiconductor ROM device on a semiconductor substrate comprising, depositing a first layer composed of a material selected from polysilicon and polycide on the substrate, patterning the first layer by masking and etching, depositing a dielectric layer over the first layer and patterning the dielectric layer and the first layer into the pattern of first conductor lines, forming a contact window through the dielectric layer down to the substrate, depositing a second layer composed of a material selected from polysilicon and polycide on the device and forming second conductor lines directed orthogonally to the first conductor lines formed from the first layer, and ion implanting into the substrate through the second layer to form a contact region electrically connected to the second conductor lines of the second layer.

Preferably, the first layer comprises word lines, the second layer comprises bit lines; the second layer extends between conductor lines of the first layer into direct contact with the contact regions in the substrate; the contact regions are located diagonally on opposite sides of the word lines; the second layer is ion implanted with arsenic; alternatively, the first layer comprises bit lines, the second layer comprises word lines; the second layer extends between conductor lines of the first layer into direct contact with the contact regions in the substrate; the second layer is etched to define the word lines and form a shallow trench on etched regions.

In accordance with another aspect of this invention, a semiconductor ROM device formed on a semiconductor substrate comprises a first layer composed of a material selected from polysilicon and polycide on the substrate, a dielectric layer over the first layer, the dielectric layer and the first layer patterned in the shape of first conductor lines, a contact window through the dielectric layer down to the substrate, a second layer composed of a material selected from polysilicon and polycide on the device and formed as second conductor lines directed orthogonally to the first conductor lines formed from the first layer, and self aligned ion implanted contact regions in the substrate formed through the second second conductor lines, the contact regions being electrically connected to the second conductor lines of the second layer.

Preferably, the bit lines extend between the word lines into direct contact with the contact regions in the substrate; the bit lines are ion implanted with arsenic; and the bit lines are separated by trenches etched in the substrate.

BRIEF DESCRIPTION OF THE DRAWINGS

The foregoing and other aspects and advantages of this invention are explained and described below with reference to the accompanying drawings, in which:

FIG. 1 shows a prior art device including a semiconductor substrate composed of P− doped silicon with buried BN+ layer in the substrate oriented vertically.

FIGS. 2A-2C show views of a device incorporating a first embodiment of this invention.

FIG. 2A is a plan view of a fragment of a semiconductor device on a semiconductor substrate with the bit lines and word lines deposited upon the substrate.

FIG. 2B shows a section taken along lines 2B—2B in FIG. 2A. The silicon dioxide layer, which overlies the substrate has openings therethrough for contacts Portions of polysilicon 2 (or polycide) bit lines are formed reaching down to form contacts with the N+ regions.

FIG. 2C shows a section of the device of FIG. 2A taken along lines 2C—2C therein.

FIGS. 4A and 4B show a prior art conventional buried N+ ROM cell with a P− semiconductor substrate, polysilicon 1 lines, buried bit lines and current line from the high voltage bit line through line to the lower voltage bit line. The gate oxide is located between the buried bit lines and the polysilicon 1 lines.

FIG. 23A is a plan view of a fragment of a semiconductor device on a semiconductor substrate with the bit lines and word lines. Contact regions composed of ion implanted regions are located in the semiconductor substrate beneath the bit lines and between or adjacent to the word lines.

FIG. 23B shows a section taken along lines 23B—23B in FIG. 23A. Silicon dioxide layer overlies word lines and in a stacked arrangement. About the periphery of the stack of wordlines and are silicon dioxide spacer structures. Bit line passes over each of the word lines and it is separated therefrom by spacers and silicon dioxide layers which overlie each of the word lines. Portions of polysilicon 2 or polycide bit line reach down between the spacer structures in contact with the N+ regions.

FIG. 23C shows a section of the device of FIG. 23A taken along lines 23C—23C therein.

FIG. 24A is a plan view of a fragment of a semiconductor device on a semiconductor substrate with the bit lines and word lines. FIG. 24B is a section taken along line 24B—24B in FIG. 24A.

DESCRIPTION OF THE PREFERRED EMBODIMENT

Figure 3A:
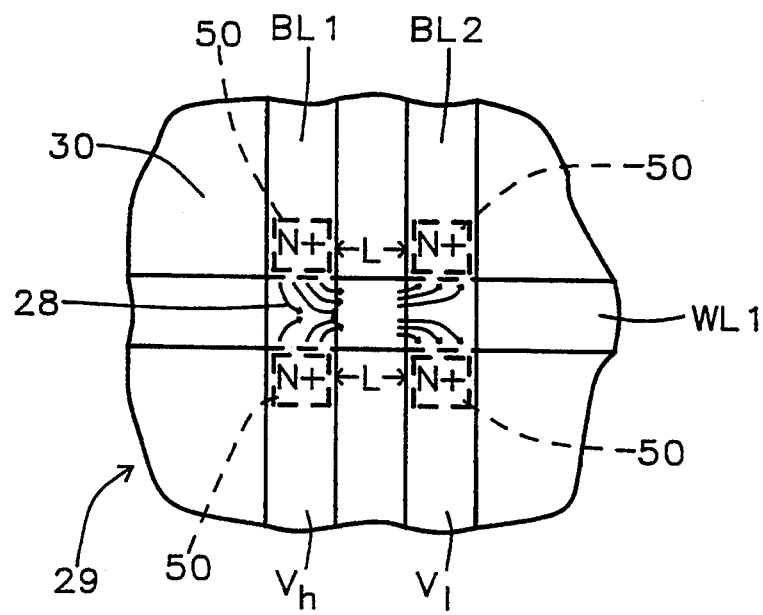
FIG. 3A shows a plan view of a fragment of a device in accordance with this invention including Just a word line and several bit lines.

FIGS. 2A-2C show views of a device incorporating a first embodiment of this invention. FIG. 2A is a plan view of a fragment of a semiconductor device 29 on a semiconductor substrate 30 with the bit lines BL1, BL2 and BL3, word lines WL1, WL2, WL3, and WL4. Contact region 50 composed of ion implanted regions are located in the semiconductor substrate 30 beneath the bit lines BL1, BL2 and BL3 and between the word lines WL1, WL2, WL3, and WL4. The direction of current flow is indicated by current flow lines 28 in the device 29 through word line WL2 from contact regions 50 below bit line BL1 towards bit line BL2 and to the contact regions 50 below bit line BL2. Additional current flow lines 28 in other parts of device 29 are omitted for convenience of illustration.

FIG. 2B shows a section taken along lines 2B—2B in FIG. 2A. The silicon dioxide layer 54 which overlies substrate 30 has openings therethrough for contacts 56. Portions of polysilicon 2 (or polycide) bit lines BL1, BL2 and BL3 are formed reaching down to form contacts 56 with the N+ regions 50.

FIG. 2C shows a section of the device of FIG. 2A taken along lines 2C—2C therein. It can be seen that bit line BL2 reaches down through the gate oxide layer 52 to contact each of the N+ regions 50, and that the bit line BL2 passes over each of the word lines WL1, WL2, WL3, and WL4 and that it is separated therefrom by spacers 57 and silicon dioxide layers 55 which overlie each of the word lines WL1, WL2, WL3, and WL4.

FIG. 3A shows a plan view of a fragment of device 29 including just the word line WL1 and bit lines BL1 and BL2. The N+ regions 50 on either side of the word line WL1 beneath the bit lines BL1 and BL2 are shown with the device current flow lines 28 passing from the N+ regions 50 near the bit line BL1 which is at a relatively high voltage $V_h$ through the word line WL1 to the N+ regions 50 near the bit line BL2, which is at a relatively low voltage $V_l$.

Figure 3B:
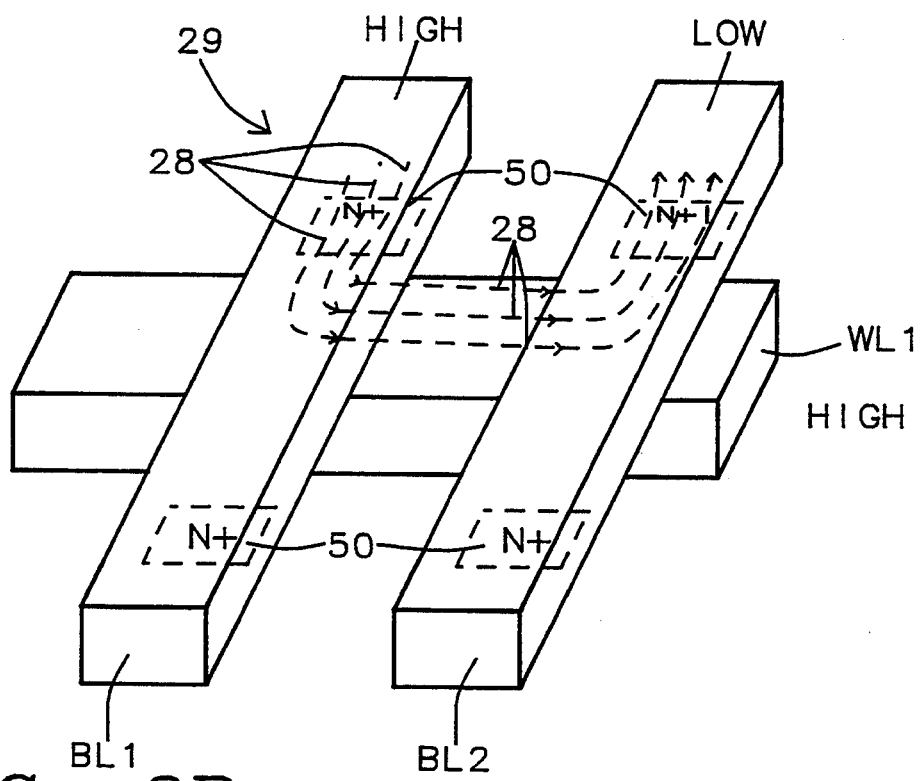
FIG. 3B shows a perspective schematic view of the device.

FIG. 3B shows a perspective schematic view of the device of FIG. 3A illustrating the general direction of flow of current from the bit line BL1 through the contact region 50 to substrate 30, then through the channel beneath the word line WL1 flow to the contact region 50 then up to the bit line BL2. The level of regions 50 and the structure of bit lines BL1 and BL2 have been flattened for convenience of illustration, as actually bit lines BL1 and BL2 rise over the word line WL1 and the interpolysilicon layer therebetween.

FIGS. 5-12 show cross-sectional views taken along line 2C—2C in FIG. 2A illustrating steps in the process of forming a bit line and bit line contact formation including the formation of a self aligned contact (SAC).

Figure 5:
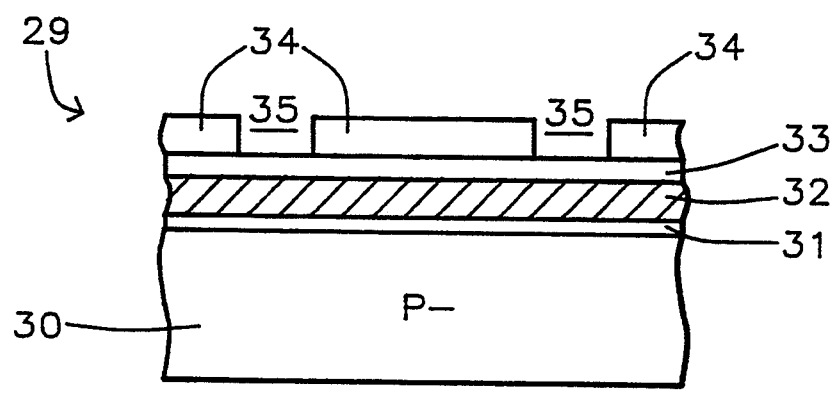
FIGS. 5-12 show cross-sectional views taken along line 2C—2C in FIG. 2A illustrating steps in the process of forming a bit line and bit line contact formation including the formation of a self aligned contact (SAC).

FIG. 5 shows a cross-sectional view of a semiconductor device 29 illustrating the early steps of forming the first embodiment of this invention. The semiconductor device 29 is formed on a semiconductor substrate 30 with a gate oxide 31 coated with a polysilicon 1 or polycide layer 32.

Dopant ions composed of phosphorous $P_{31}^+$ or arsenic $As^+$ are implanted into layer 32. The dopant is applied at a preferred dose of $1 \times 10E16$ cm$^{-2}$ of $P_{31}^+$ at a preferred energy of 60 keV to provide a far higher level of doping or use $POCl_3$ doping at 900° C. A range of energies from approximately 30 keV to approximately 80 keV is possible. A range of doses from approximately $5 \times 10E15$ cm$^{-2}$ to approximately $2 \times 10E16$ cm$^{-2}$ is possible.

An silicon dioxide layer 33 is deposited by chemical vapor deposition CVD to a thickness of from approximately 1,000 Å to approximately 3,000 Å employing SiH$_4$/O$_2$ at 450° C.

Next, the polysilicon 1 or polycide layer 32 and layer 33 are coated with a layer of photoresist which is then photolithographically patterned to form a mask 34 with the shape shown in FIG. 5 with openings 35 therethrough.

Figure 6:
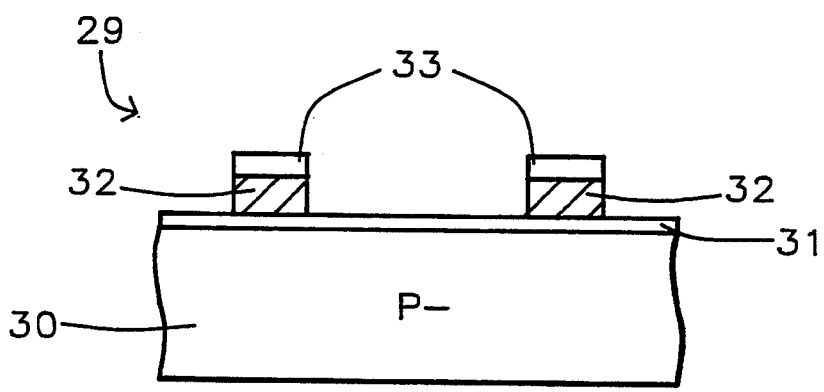

Referring to FIG. 6, the polysilicon 1 or polycide layer 32 and layer 33 are then etched by a polysilicon or polycide plasma etcher, forming word lines 32 with the layer 33 remaining above them.

Figure 7:
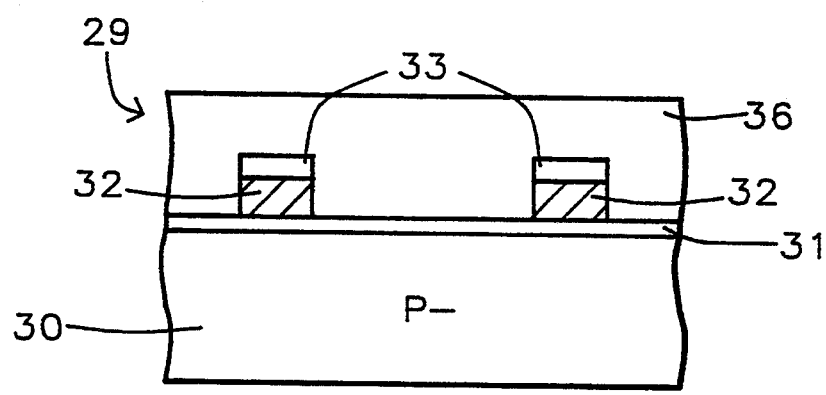

In FIG. 7, the product of FIG. 6 is now coated with silicon dioxide layer 36 by CVD oxide deposition to a thickness of from approximately 1,000 Å to approximately 3,000 Å.

Figure 8:
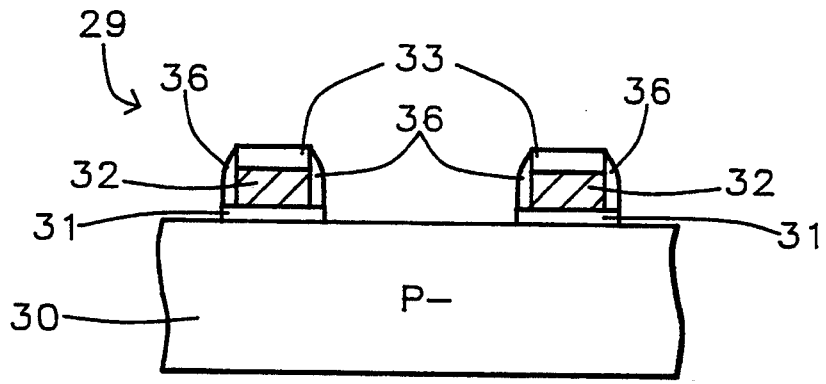

FIG. 8 shows the product of FIG. 7 after etching by an oxide RIE etcher etching back to form spacers 36.

Figure 9:
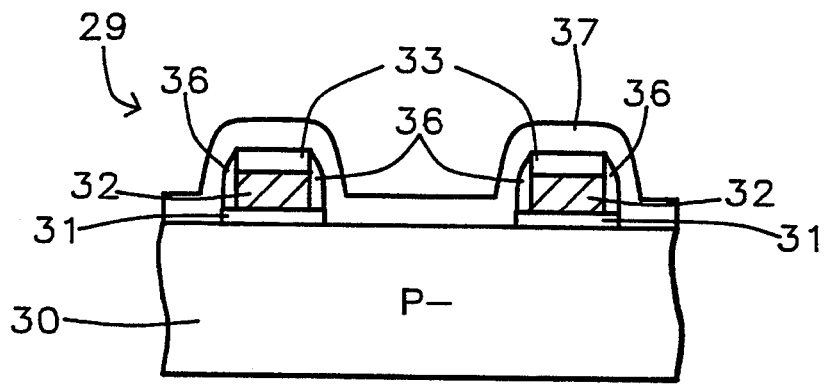

FIG. 9 shows the product of FIG. 8 with a dielectric layer 37 composed of SiO$_2$ (silicon dioxide) or Si$_3$N$_4$ (silicon nitride.)

Figure 10:
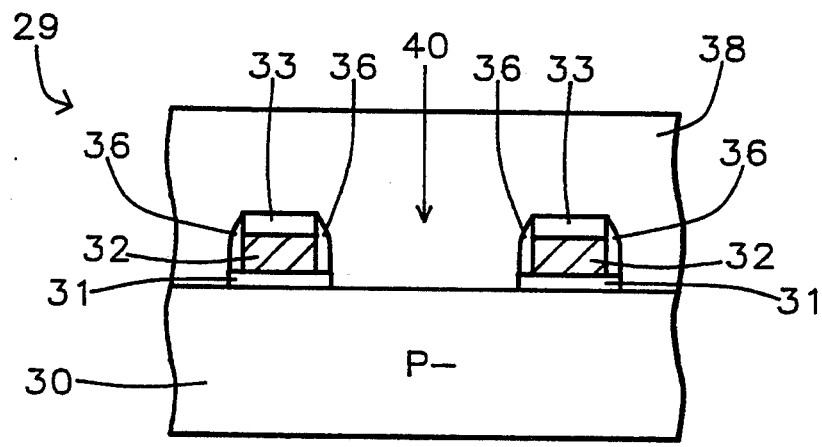

FIG. 10 shows the product of FIG. 9 after a photoresist mask 38 has been formed and opened with an open strip (contact opening 50 in FIG. 2A) along the section line of FIGS. 9 and 10 which is a section line taken along line 2C—2C in FIG. 2A. The photoresist layer 38 is seen in the background. Then the dielectric layer 37 is etched away using the process of plasma oxide or nitride etching back to form a contact window 40 down to substrate 30.

Figure 11:
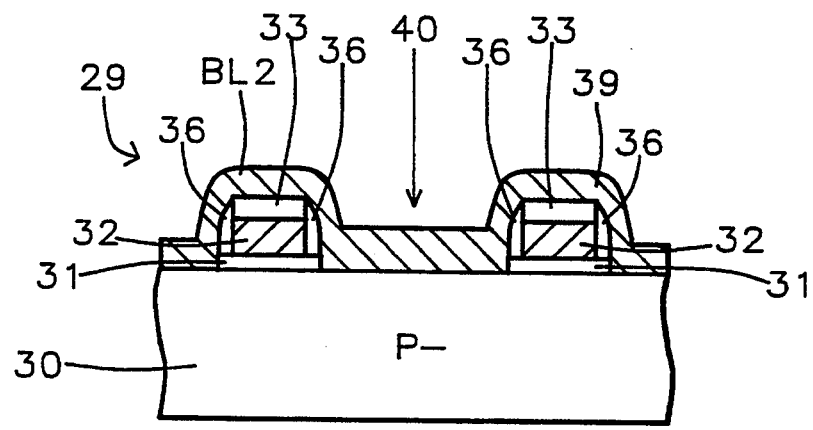

FIG. 11 shows the product of FIG. 10 after a polysilicon 2 or polycide conductor layer 39 comprising a bit line BL2 has been formed on the surfaces of the device 29 with portions in contact with the exposed substrate 30.

Figure 12:
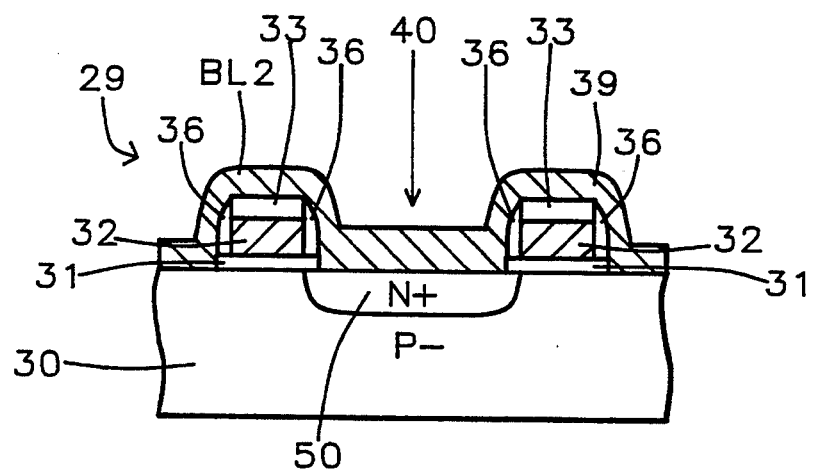

FIG. 12 shows the product of FIG. 11 after dopant ions composed of phosphorous P$_{31}$+ or arsenic As+ doped or ion implanted are implanted into layer 39 and through the BL2 layer 39 into substrate 30 to form N+ contact region 50. Preferably, the dopant is applied at a preferred dose of $1 \times 10E16$ cm$^{-2}$ of phosphorous P$_{31}$+ at a preferred energy of 60 keV to provide a far higher level of doping. Alternatively, N+ contact region 50 can be doped with a polysilicon 2 or polycide dopant using autodoping by a back end temperature process or contact doping immediately after the contact opening is made as shown and described above with reference to FIG. 10.

FIGS. 13A and 13B and FIGS. 14A–14C show views of a device incorporating a second embodiment of this invention.

Figure 13A:
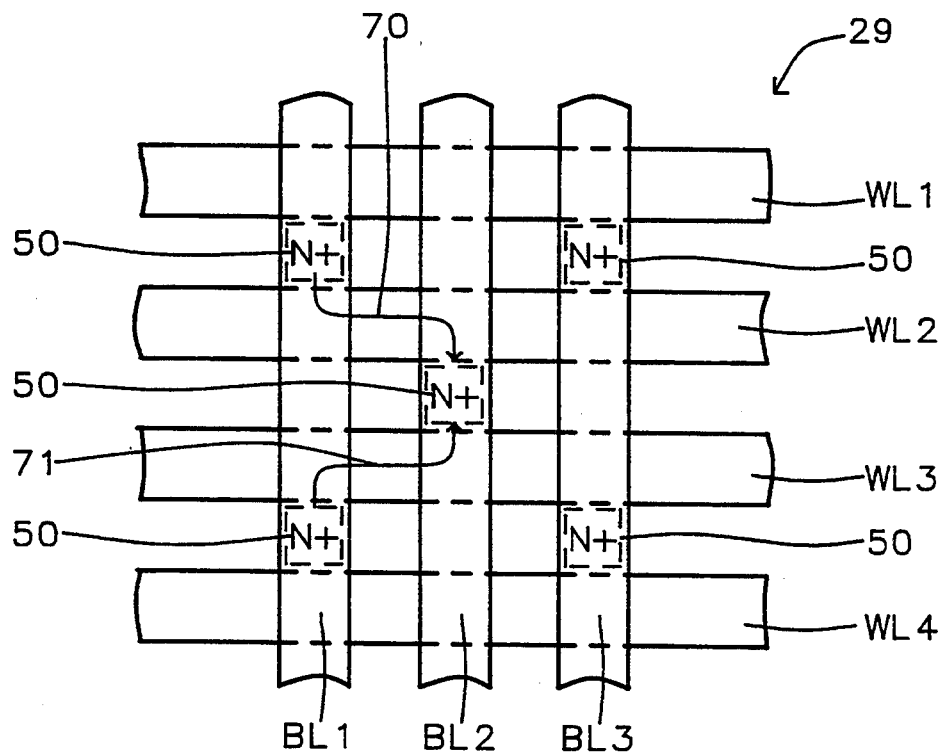
FIGS. 13A and 13B and FIGS. 14A-14C show views of a device incorporating a second embodiment of this invention.
Figure 13B:
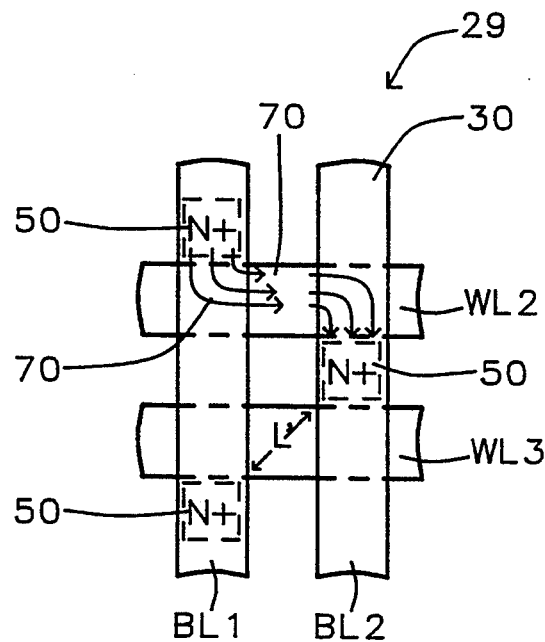

FIG. 13A is a plan view of a fragment of a semiconductor device 29 on a semiconductor substrate 30 with the bit lines BL1, BL2 and BL3, word lines WL1, WL2, WL3, and WL4. FIG. 13B is a similar plan view of a smaller section of FIG. 13A. Contact regions 50 composed of ion implanted regions are located in the semiconductor substrate 30 beneath the bit lines BL1, BL2 and BL3 and between the word lines WL1, WL2, WL3, and WL4. The direction of current flow is indicated by current flow lines 70 and 71 in the device 29. Current flow line 70 passes from bit line BL1 through N+ region 50 through the channel in substrate 30 beneath wordline WL2 to the next N+ region 50 up to bit line BL2. The flow line 71 also passes from bit line BL1 through another N+ region 50 through the channel in substrate 30 beneath the word line WL3 to another contact region 50 up to bit line BL2. Additional current flow lines in other parts of device 29 are omitted for convenience of illustration.

FIG. 13B shows the minimum channel length L' provided by diagonally arranging the N+ regions 50. With the same device margin this approach can make bit line pitch smaller which accordingly affords higher packing density.

Advantages include a bit line sheet resistance depends on the conductor.

TABLE I

| Sheet resistance (ohms/square) | |
|---|---|
| Polysilicon | 15~50 |
| Tungsten Silicide (WSi$_2$) | 5~10 |
| Titanium Silicide (TiSi$_2$) | 2~5 |
| Tungsten | <5 |
| Al alloy | <1 |

Bit line formation after the polysilicon or polycide gate so the backend temperature cycle is less than conventional buried N+ process, so BN+ lateral diffusion is less than BN+ to BN+, punchthrough voltage will increase.

Figure 14A:
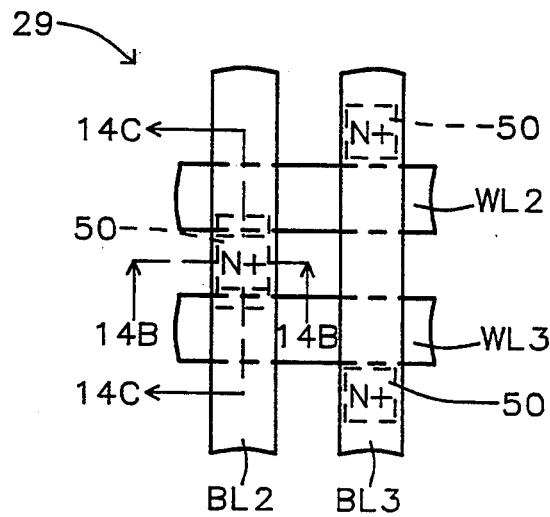
Figure 14B:
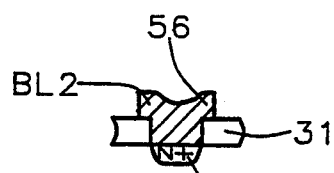
Figure 14C:
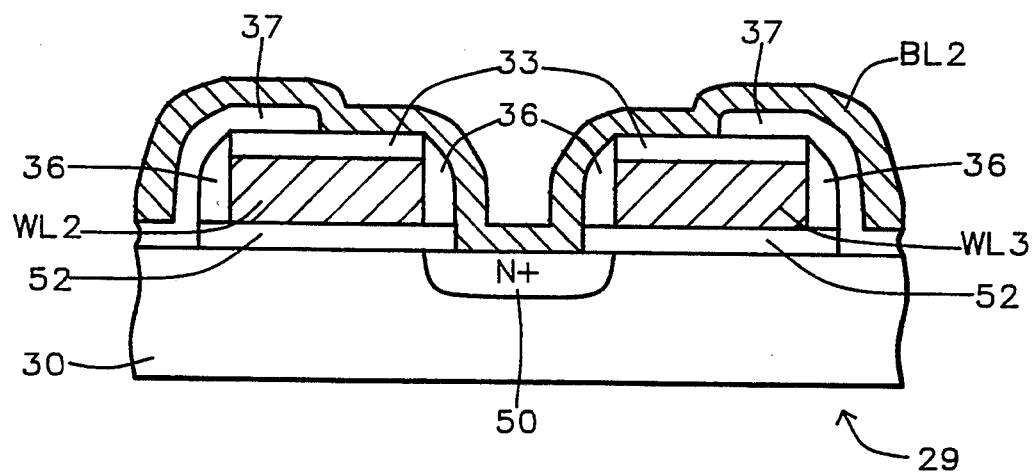

FIGS. 14A–14C show additional views of a device incorporating a second embodiment of this invention. FIG. 14B shows a section taken along lines 14B—14B in FIG. 14A. The silicon dioxide layer 52 which overlies substrate 30 has openings 56 therethrough. Portions of polysilicon 2 or polycide bit lines BL2 is formed reaching down to form contact 56 with the N+ regions 50.

FIG. 14C shows a section of the device of FIG. 14A taken along lines 14C—14C therein. It can be seen that bit line BL2 reaches down through the gate oxide layer 52 to contact each the N+ contact region 50, and that the bit line BL2 passes over each of the word lines WL2 and WL3 and that it is separated therefrom by spacers 36 and silicon dioxide layers 33 which overlie each of the word lines WL2 and WL3. Laterally from the central portion of the device, the dielectric layer 37 composed of SiO$_2$ (silicon dioxide) or Si$_3$N$_4$ (silicon nitride) overlies the layers 33 and spacers 36 beneath the bit line BL2.

FIGS. 15–22 show the process of forming a bit line and bit line contact formation including the formation of a self aligned contact (SAC).

Figure 15:
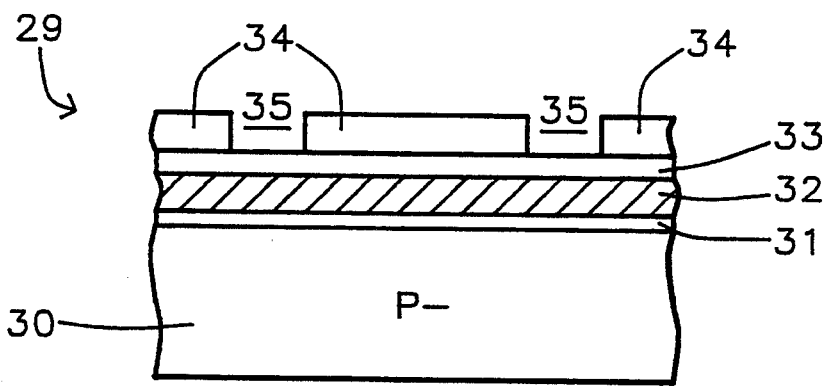
FIGS. 15-22 show the process of forming a bit line and bit line contact formation including the formation of a self aligned contact (SAC).

FIG. 15 shows a sectional view of a semiconductor device 29 illustrating the early steps of forming the first embodiment of this invention. The semiconductor device 29 is formed on a semiconductor substrate 30 with a gate oxide 31 coated with a polysilicon 1 or polycide layer 32.

Dopant ions composed of phosphorous P$_{31}$+ or arsenic As+ are implanted into layer 32. The dopant is applied at a preferred dose of $1 \times 10E16$ cm$^{-2}$ of P$_{31}$+ at a preferred energy of 60 keV to provide a far higher level of doping or use POCl$_3$ doping at 900° C. A range of energies from approximately 30 keV to approximately 80 keV is possible. A range of doses from approximately $5 \times 10E15$ cm$^{-2}$ to approximately $2 \times 10E16$ cm$^{-2}$ is possible.

An silicon dioxide layer 33 is deposited by chemical vapor deposition CVD to a thickness of from approximately 1,000 Å to approximately 3,000 Å employing SiH$_4$/O$_2$ at 450° C.

Next, the polysilicon 1 or polycide layer 32 and layer 33 are coated with a layer of photoresist which is then photolithographically patterned to form a mask 34 with the shape shown in FIG. 15 with openings 35 therethrough.

A silicon dioxide layer 33 is deposited by CVD in a to a thickness of from approximately 1,000 Å to approximately 3,000 Å.

Next, the polysilicon 1 or polycide layer 32 and layer 33 are coated with a layer of photoresist which is then photolithographically patterned to form a mask 34 with the shape shown in FIG. 15 with openings 35 therethrough.

Figure 16:
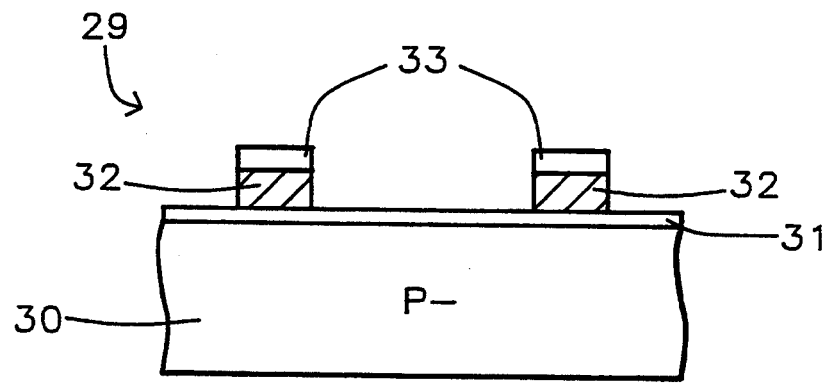

Referring to FIG. 16, the polysilicon 1 or polycide layer 32 and layer 33 are then etched by a polysilicon or polycide plasma etcher, forming word lines 32 with the layer 33 remaining above them.

Figure 17:
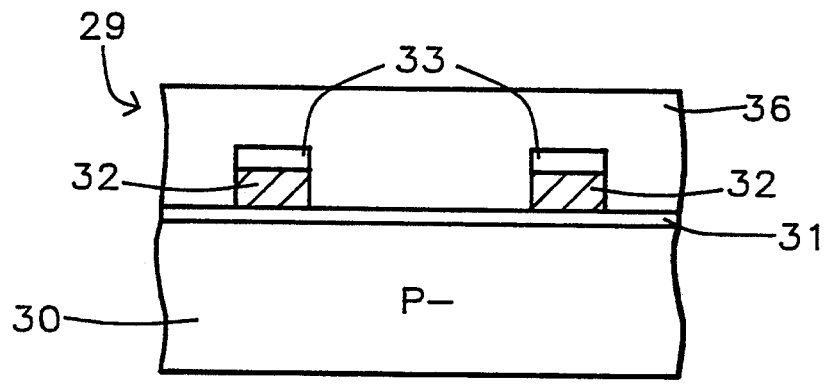

In FIG. 17, the product of FIG. 16 is now coated with silicon dioxide layer 36 by CVD oxide deposition to a thickness of from approximately 1,000 Å to approximately 3,000 Å.

Figure 18:
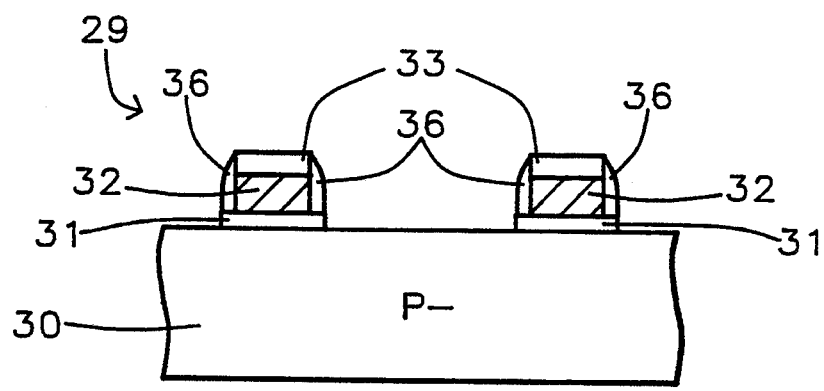

FIG. 18 shows the product of FIG. 17 after etching with an oxide RIE etcher etching back to form spacers 36.

Figure 19:
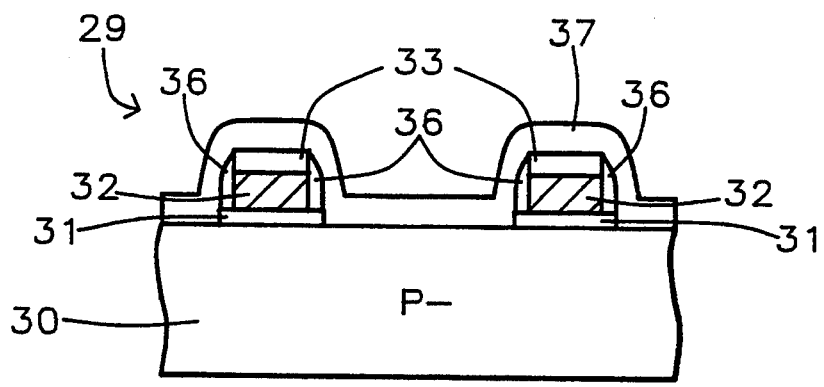

FIG. 19 shows the product of FIG. 18 with a dielectric layer 37 composed of SiO$_2$ or Si$_3$N$_4$.

Figure 20:
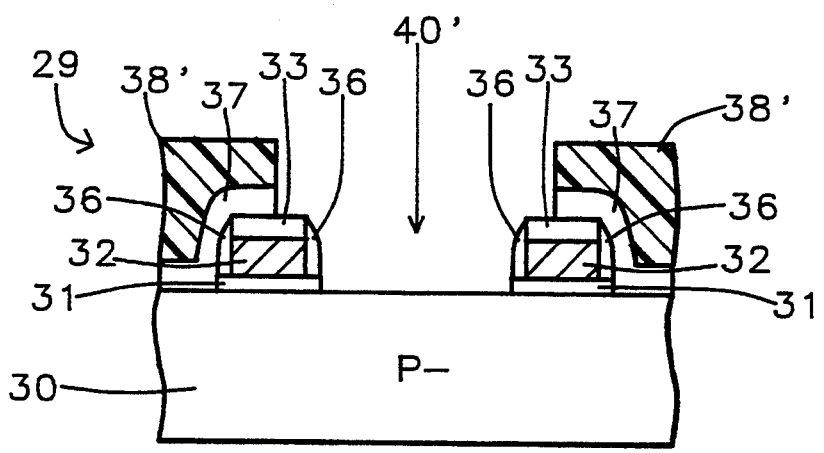

FIG. 20 shows the product of FIG. 19 after a mask formed of a photoresist layer 38' has been formed and opened with an open strip along the section line of FIGS. 9 and 10 which is a section line taken along line 2C—2C in FIG. 2A. The photoresist layer 38' is open in area 40 between word lines 32. Then dielectric layer 37 is etched away forming a contact window 40' as an opening down to the substrate 30.

Figure 21:
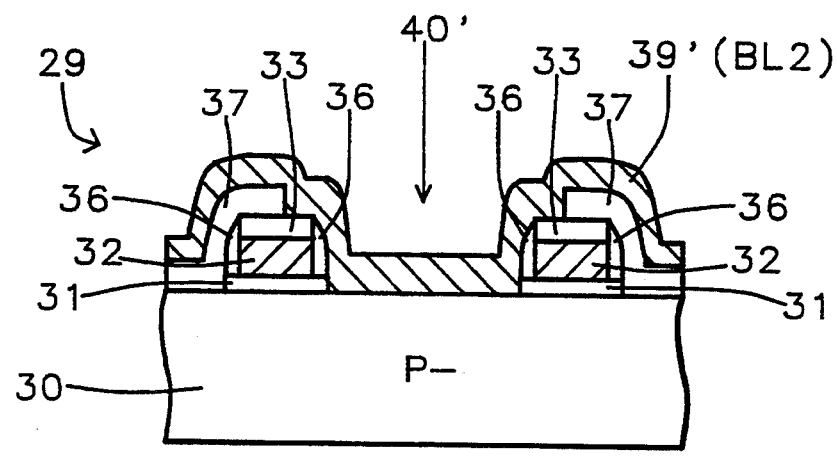

FIG. 21 shows the product of FIG. 20 after a polysilicon 2 or polycide conductor layer 39' comprising a bit line BL2 has been formed on the surfaces of the device 29.

Figure 22:
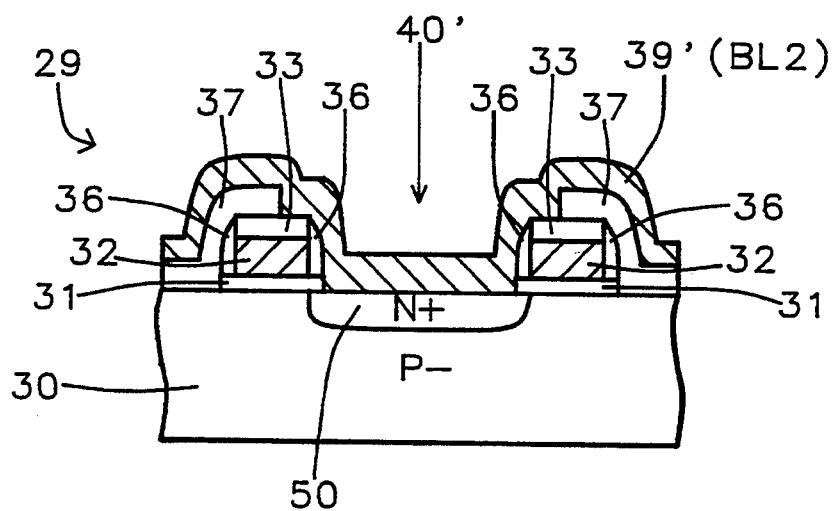

FIG. 22 shows the product of FIG. 21 after dopant ions composed of phosphorous P$_{31}$+ or arsenic As+ doped or ion implanted are implanted into layer 39' and through the BL2 layer 39' into substrate 30 to form N+ contact region 50. Preferably, the dopant is applied at a preferred dose of 1×10E16 cm$^{-2}$ of phosphorous P$_{31}$+ at a preferred energy of 60 keV to provide a far higher level of doping.

Second Embodiment

Method 1

The basic elements of the second embodiment follow:
1. Use polysilicon 2 or polycide in direct contact to all cell silicon area except for the word line regions.
2. Polysilicon 2 is implanted with arsenic As+ to prevent N+ dopant diffusion into all silicon areas.
3. Polysilicon 2 is etched to define the bit line and shallow trench on the etched area.
4. Polysilicon 2 is annealed to form a bit line contact N+ dopant automatically formed through the polysilicon 2 or polycide diffusion to the silicon substrate.

Figure 23A:
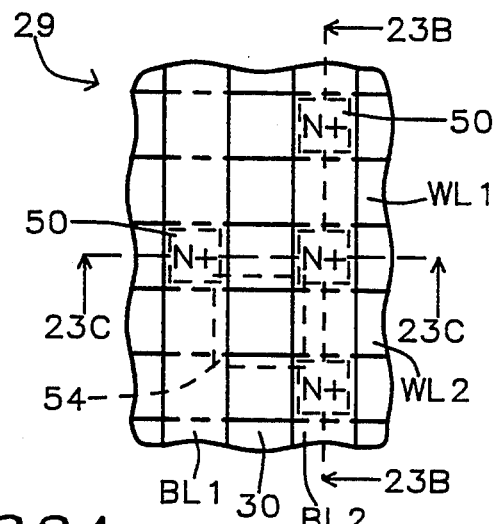
FIGS. 23A-23C show another embodiment of the present invention.
Figure 23B:
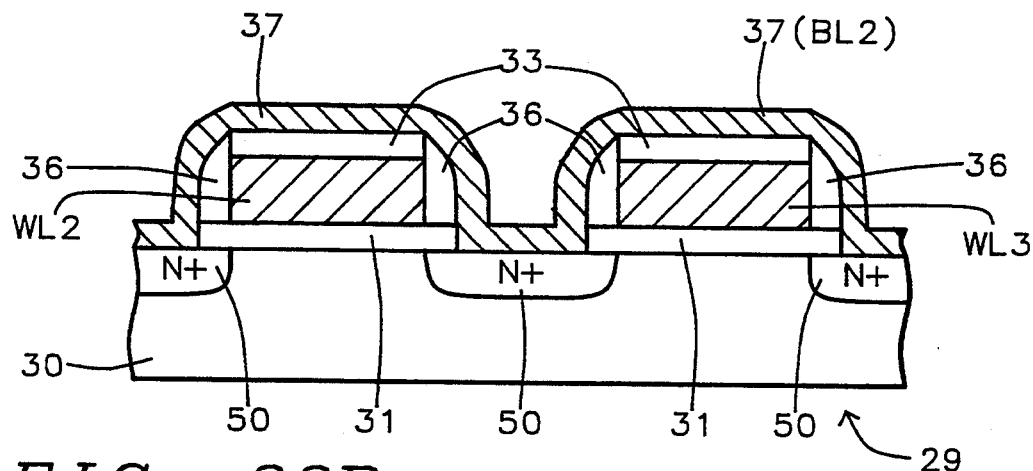
Figure 23C:
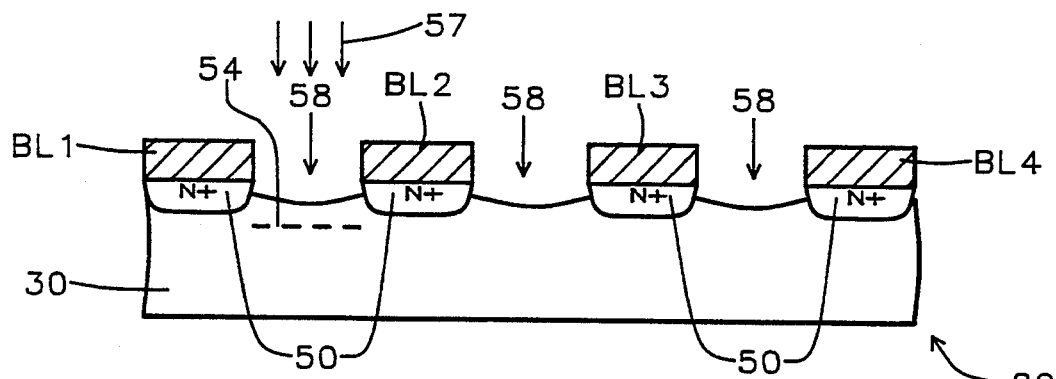

FIGS. 23A–23C show another embodiment of the present invention. FIG. 23A is a plan view of a fragment of a semiconductor device 29 on a semiconductor substrate 30 with the bit lines BL1 and BL2 and word lines WL1 and WL2. Contact regions 50 composed of ion implanted regions are located in the semiconductor substrate 30 beneath the bit lines BL1 and BL2 and between or adjacent to the word lines WL1 and WL2.

FIG. 23B shows a section taken along lines 23B—23B in FIG. 23A. Silicon dioxide layer 33 overlies word lines WL2 and WL3 in a stacked arrangement. About the periphery of the stack of wordlines WL2 and WL3 are silicon dioxide spacer structures 36. Bit line BL2 passes over each of the word lines WL2 and WL4 and it is separated therefrom by spacers 36 and silicon dioxide layers 33 which overlie each of the word lines WL2 and WL3. Portions of polysilicon 2 or polycide bit line BL2 reach down between the spacer structures 36 in contact with the N+ regions 50.

FIG. 23C shows a section of the device of FIG. 23A taken along lines 23C—23C therein. It can be seen that bit lines BL1, BL2, BL3 and BL4 form direct contacts 56 with substrate 30 and N+ doped regions 50 under the bit lines are auto-diffused after the polysilicon 2 or polycide annealing step. The silicon trench 58 is formed during etching of the polysilicon 2 or polycide layer. A code implant region 54 in FIGS. 23A and 23C are implanted by ions 57. Dopant ions 57 composed of B$_{11}$+ are implanted through the trench 58 into substrate 30 to form code implant region 54.

The code implant dopant ions 57 are implanted at a preferred dose of 1×10E13 cm$^{-2}$ of BF$_2$ at a preferred energy of 60 keV to provide a far higher level of doping than in the remainder of the substrate 30. A range of energies from approximately 30 keV to approximately 100 keV is possible. A range of doses from approximately 3×10E12 cm$^{-2}$ to approximately 3×10E13 cm$^{-2}$ is possible.

The process steps for the embodiment shown by FIGS. 23A–23C are as follows:

Polysilicon 1 is deposited in a stack with a cap comprising a silicon dioxide layer 33 with a thickness of from approximately 1,000 Å to approximately 3,000 Å.

Polysilicon 1 is defined by masking and etching as described above.

A spacer oxide is deposited and then a spacer etch is performed in the open ROM cell area only.

Polysilicon 2 is deposited and then ion implanted with arsenic (As+5 E 15.)

Polysilicon 2 is masked and etched.

The cell isolation region is implanted and if necessary it is self-aligned.

The polysilicon 2 or polycide layer is annealed (bit line contact dopant is driven in.)

Then BPSG, contact, metallization and back end process steps follow.

Method 2

Figure 24A:
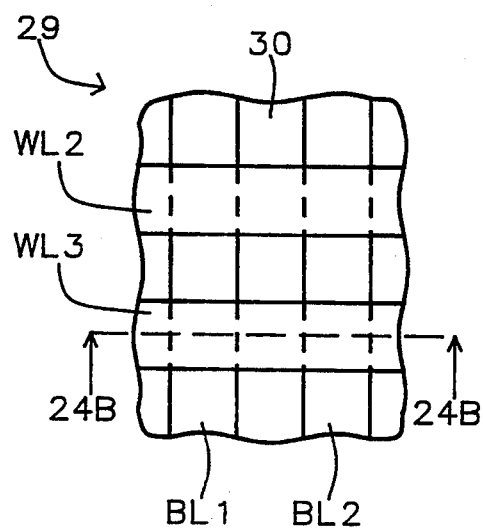
FIGS. 24A-24B illustrate another embodiment of a device made in accordance with the second embodiment of present invention.
Figure 24B:
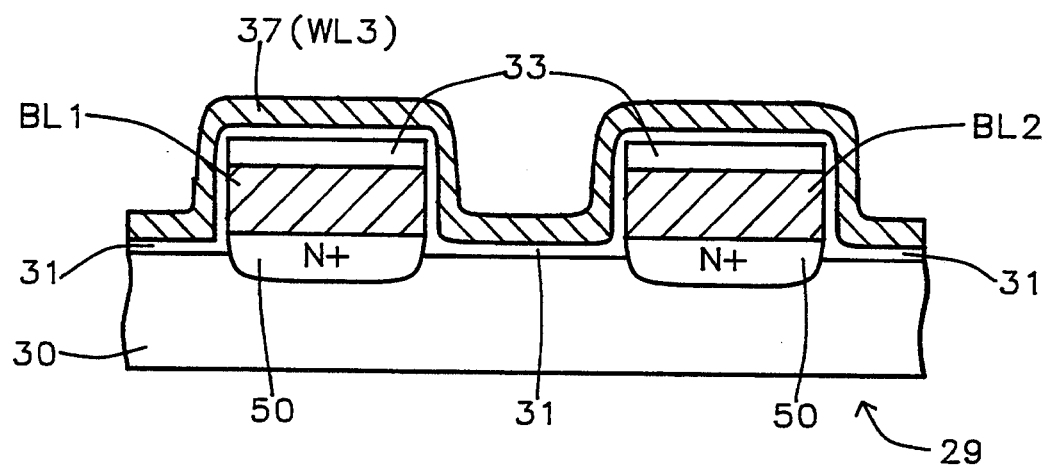

FIGS. 24A–24B illustrate another embodiment of a device made in accordance with the second embodiment of present invention. FIG. 24A is a plan view of a fragment of a semiconductor device 29 on a semiconductor substrate 30 with the bit lines BL1 and BL2 and word lines WL2 and WL3. FIG. 24B is a section taken along line 24B—24B in FIG. 24A. Contact regions 50 composed of ion implanted regions are located in the semiconductor substrate 30 beneath the bit lines BL1 and BL2, however the bit lines are formed of the polysilicon 1 or polycide layer and the word lines WL2 and WL3 cross above the bit lines separated by layer 33 and interpolysilicon layer 31.

The same layout is used with this method as above, but the bit lines are formed from the lower polysilicon or polycide layer. Polysilicon 1 layer is in direct contact with the whole area. The ROM cell has a slight trench due to a polysilicon 1 or polycide etching step. The N+ contact region 50 is doped by polysilicon 1 or polycide dopant diffusion.

Polycide or Polysilicon

Where polysilicon or polycide are employed, and polycide is employed instead of polysilicon, the polycide is selected from the group consisting of $WSi_2$, $TiSi_2$, $CoSi_2$, $MoSi_2$, and $TaSi_2$.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacture of a semiconductor ROM device on a semiconductor substrate comprising, depositing a first layer composed of a material selected from polysilicon and polycide on said substrate, patterning said first layer by masking and etching, depositing a dielectric layer over said first layer and patterning said dielectric layer and said first layer into the pattern of first conductor lines, forming a contact window through said dielectric layer down to said substrate, depositing a second layer composed of a material selected from polysilicon and polycide on said device and forming second conductor lines directed orthogonally to said first conductor lines formed from said first layer, and ion implanting into said substrate through said second layer to form a contact region electrically connected to said second conductor lines of said second layer.

2. A method of manufacture in accordance with claim 1 wherein said first layer comprises word lines, said second layer comprises bit lines.

3. A method of manufacture in accordance with claim 2 wherein said second layer extends between conductor lines of said first layer into direct contact with said contact regions in said substrate.

4. A method of manufacture in accordance with claim 2 wherein said contact regions are located diagonally on opposite sides of said word lines.

5. A method of manufacture in accordance with claim 2 wherein said second layer is ion implanted with arsenic.

6. A method of manufacture in accordance with claim 1 wherein said second layer is ion implanted with arsenic.

7. A method of manufacture in accordance with claim 1 wherein said second layer comprises word lines, said first layer comprises bit lines.

8. A method of manufacture in accordance with claim 7 wherein said second layer extends between conductor lines of said first layer into direct contact with said contact regions in said substrate.

9. A method of manufacture in accordance with claim 7 wherein said second layer is ion implanted with arsenic.

10. A method of manufacture in accordance with claim 7 wherein said second layer is etched to define the word lines and form a shallow trench on etched regions.

11. A method of manufacture of a semiconductor ROM device on a semiconductor substrate comprising, depositing a word line layer composed of a material selected from polysilicon and polycide on said substrate, patterning said word line layer by masking and etching, depositing a dielectric layer over word line layer and patterning said dielectric layer and said word line layer into the pattern of conductor lines, forming a contact window through said dielectric layer down to said substrate, depositing a bit line layer composed of a material selected from polysilicon and polycide on said device and forming bit line conductor lines directed orthogonally to said word lines, and ion implanting into said substrate through said bit lines to form bit contact regions electrically connected to said bit line layer.

12. A method of manufacture in accordance with claim 11 wherein said word line layer comprises word lines, and said bit line layer comprises bit lines.

13. A method of manufacture in accordance with claim 12 wherein said bit line layer extends between conductor lines of said word line layer into direct contact with said contact regions in said substrate.

14. A method of manufacture in accordance with claim 12 wherein said contact regions are located diagonally on opposite sides of said word lines.

15. A method of manufacture in accordance with claim 12 wherein said bit line layer is ion implanted with arsenic.

16. A method of manufacture in accordance with claim 12 wherein said bit line layer is etched to define the bit line and form a shallow trench on etched regions.

* * * * *